(12) United States Patent
Schuetz et al.

(10) Patent No.: US 10,895,590 B2
(45) Date of Patent: Jan. 19, 2021

(54) POWER-MEASURING DEVICE AND A MEASURING SYSTEM FOR MEASURING THE POWER OF SEVERAL PHASES IN A MULTIPHASE SYSTEM

(71) Applicant: ROHDE & SCHWARZ GMBH & CO. KG, Munich (DE)

(72) Inventors: Andreas Schuetz, Karlstein (DE); Eugen Geier, Hainburg (DE); Holger Asmussen, Muelheim (DE); Josef Vogel, Plankstadt (DE)

(73) Assignee: ROHDE & SCHWARZ GMBH & CO. KG, Munich (DE)

(*) Notice: Subject to any disclaimer, the term of this patent is extended or adjusted under 35 U.S.C. 154(b) by 191 days.

(21) Appl. No.: 15/522,630

(22) PCT Filed: May 30, 2016

(86) PCT No.: PCT/EP2016/062166
§ 371 (c)(1),
(2) Date: Apr. 27, 2017

(87) PCT Pub. No.: WO2016/193213
PCT Pub. Date: Dec. 8, 2016

(65) Prior Publication Data
US 2017/0328937 A1   Nov. 16, 2017

(30) Foreign Application Priority Data

May 29, 2015   (EP) .................................... 15169887

(51) Int. Cl.
*G01R 21/133*   (2006.01)
*G01R 19/25*   (2006.01)
*G01R 22/06*   (2006.01)

(52) U.S. Cl.
CPC ....... *G01R 21/133* (2013.01); *G01R 19/2513* (2013.01); *G01R 22/063* (2013.01)

(58) Field of Classification Search
CPC .......................... G01R 21/133; G01R 19/2513
See application file for complete search history.

(56) References Cited

U.S. PATENT DOCUMENTS 5,652,505 A * 7/1997 Brune .................. G01R 21/133
324/107
6,005,759 A * 12/1999 Hart .................... G01R 19/2513
361/62

(Continued)

FOREIGN PATENT DOCUMENTS

| DE | 102012107021 A1 | 2/2014 |
| DE | 102012107021 B4 | 10/2014 |
| EP | 2784449 A2 | 10/2014 |

OTHER PUBLICATIONS

Zhao et al, Design and Implementation of Precision Time Synchronization System Based on IEEE1588, DRPT, pp. 610-613 (Year: 2011).*

(Continued)

*Primary Examiner* — Lisa E Peters
(74) *Attorney, Agent, or Firm* — Ditthavong & Steiner, P.C.

(57) ABSTRACT

A power-measuring device serves to measure the power of a three-phase system. It comprises a measuring unit for measuring a power of a first phase of the three-phase system, a display unit for displaying measured results and an operating unit for the operation of the power-measuring device by a user. Furthermore, it comprises a communications unit by means of which it can communicate with one or more further power-measuring devices. In this context, the power-measuring device is embodied, jointly with the one or more (Continued)

Figure 1:
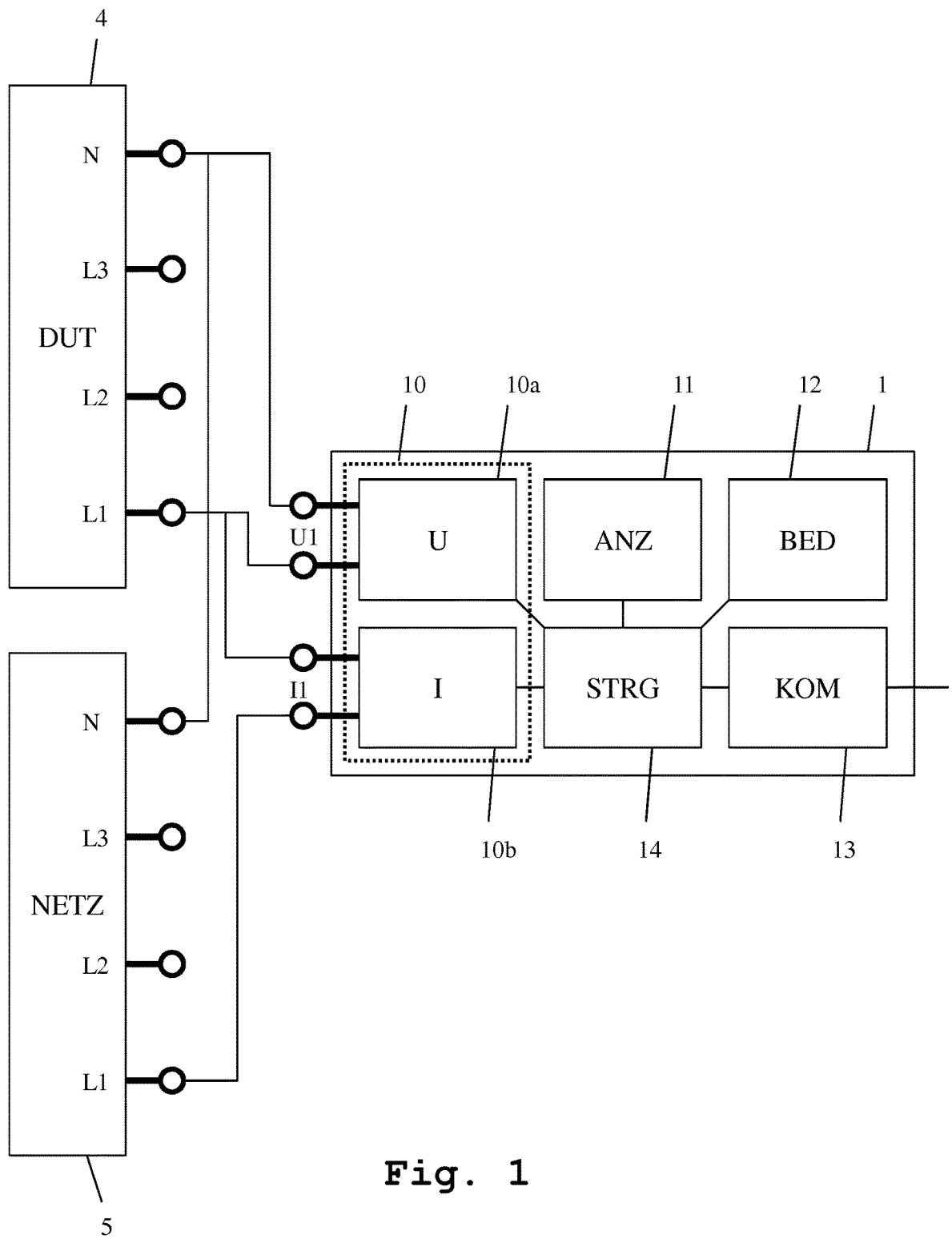

further power-measuring devices, to measure a power of several phases of the three-phase system.

16 Claims, 2 Drawing Sheets

(56) References Cited

U.S. PATENT DOCUMENTS

| | | | |
|---|---|---|---|
| 6,377,037 B1* | 4/2002 | Burns | G01R 21/133 |
| | | | 324/107 |
| 2007/0007968 A1* | 1/2007 | Mauney, Jr. | G01R 15/26 |
| | | | 324/538 |
| 2008/0036472 A1* | 2/2008 | Collins, Jr. | G01R 19/2513 |
| | | | 324/649 |
| 2009/0079371 A1* | 3/2009 | Suzuki | H02P 21/16 |
| | | | 318/400.02 |
| 2009/0292486 A1 | 11/2009 | Van Gorp et al. | |
| 2010/0315092 A1* | 12/2010 | Nacson | G01R 31/025 |
| | | | 324/510 |
| 2011/0270547 A1* | 11/2011 | Shen | G01R 21/133 |
| | | | 702/60 |
| 2012/0278016 A1 | 11/2012 | Huff et al. | |
| 2013/0110425 A1* | 5/2013 | Sharma | G01R 29/16 |
| | | | 702/62 |
| 2013/0211745 A1 | 8/2013 | Jaeger | |
| 2015/0028851 A1 | 1/2015 | Ohori et al. | |
| 2015/0061392 A1* | 3/2015 | Berard | G01R 35/005 |
| | | | 307/52 |
| 2015/0326387 A1* | 11/2015 | Dionne | G01R 19/2513 |
| | | | 375/376 |

OTHER PUBLICATIONS

Notification of Transmittal of Copies of Translation of the International Preliminary Report on Patentability (Chapter I or Chapter II); International Preliminary Report on Patentability and Written Opinion of the International Searching Authority for corresponding International Application No. PCT/EP2016/062166, dated Dec. 14, 2017, 10 Pages.

* cited by examiner

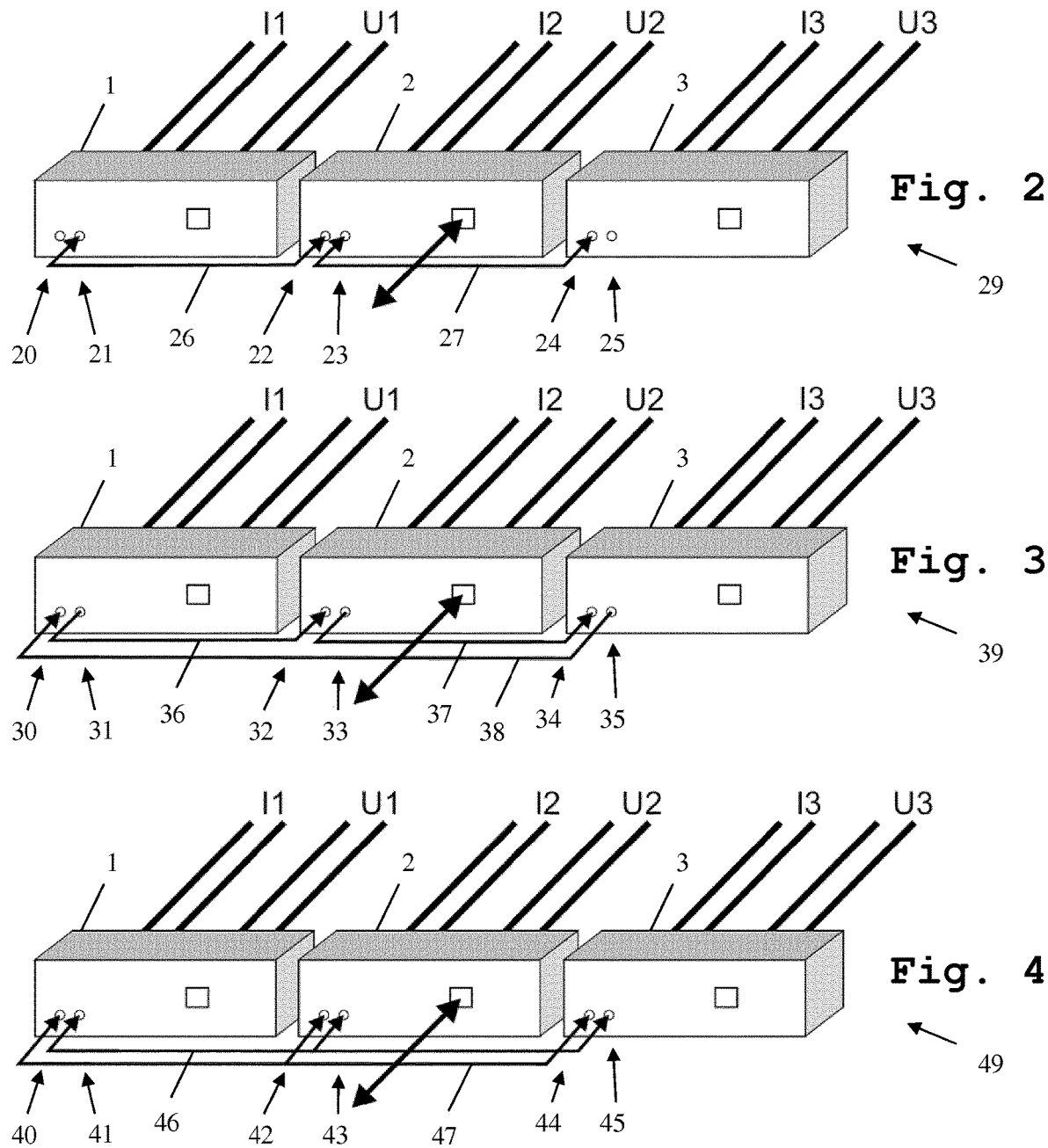

POWER-MEASURING DEVICE AND A MEASURING SYSTEM FOR MEASURING THE POWER OF SEVERAL PHASES IN A MULTIPHASE SYSTEM

CROSS-REFERENCE TO RELATED APPLICATIONS

The present application is a national phase application of PCT Application No. PCT/EP2016/062166, filed May 30, 2016, which claims priority to European Patent Application No. 15 169 887.5, filed on May 29, 2015, the entire contents of which are herein incorporated by reference.

The invention relates to a power-measuring device and a measuring system, which serve for the flexible measurement of the power on one or more phases of a multiphase system, especially a three-phase system.

Power measuring devices are conventionally designed either for measuring the power on one phase of a three-phase system or for measuring the power on three phases of a three-phase system. Simple power-measuring devices which are designed only to measure the power on one phase of a three-phase system, are cost-favourable and have only a small space requirement in a measuring set-up. Conventional measuring devices which are designed to measure the power on three phases of a three-phase system, are significantly more cost-intensive and generally have a significantly larger space requirement in a measuring set-up.

For example, document DE 10 2012 107 021 B4 shows a power-measuring device which is embodied to measure the power on three phases of a three-phase system.

Single-phase power-measuring devices have the further disadvantage that relative measurements between different phases of the three-phase system are not possible. Furthermore, this cannot be achieved by procuring a plurality of such single-phase measuring devices, because a synchronisation of the measuring devices is not possible.

The invention is based on the object of providing a power-device and a measuring system which allow an accurate measurement of multiphase systems with several phases, especially three-phase systems, but, at the same time, require only a small start-up investment.

According to the invention, the object is achieved for the power-measuring device by the features of the independent claim 1 and for the measuring system by the features of the independent claim 11. Advantageous further developments form the subject matter of the dependent claims relating back to these claims.

A power-measuring device according to the invention serves to measure the power of a multiphase system, especially a three-phase system. It comprises a measuring unit for measuring a power of a first phase of the multiphase system, a display unit for displaying measured results and an operating unit for the operation of the power-measuring device by a user. Furthermore, it comprises a communications unit, by means of which it can communicate with one or more further power-measuring devices. In this context, the power-measuring device according to the invention is embodied to measure, jointly with the one or more further power-measuring devices, a power of several phases of the multiphase system. In this manner, it is possible to use a single power-measuring device according to the invention to implement only one power measurement on one phase. Several power-measuring devices according to the invention can be used jointly to implement phase synchronised measurements on several phases of the multiphase system.

By preference, the power-measuring device can be operated in a master-mode in which the power-measuring device controls at least one further power-measuring device. Additionally, the power-measuring device can be operated in a slave-mode in which the power-measuring device is controlled by at least one further power-measuring device. This means that several structurally identical power-measuring devices according to the invention can be used for the joint measurement of the different phases.

By preference, the power-measuring device is embodied, in the master-mode, to receive measured results from the at least one further power-measuring device by means of the communications unit, and/or to display measured results of the power-measuring device and of the at least one further power-measuring device on the display unit, and/or to receive and to process operating inputs for the power-measuring device and the at least one further power-measuring device by means of the operating unit. Furthermore, the measuring device is preferably embodied, in the slave-mode, to transmit measured results to the at least one further power-measuring device by means of the communications unit, and/or not to display measured results on the display unit of the power-measuring device, and/or not to receive and process operating inputs by means of the operating unit of the power-measuring device. This means that all connected power-measuring devices according to the invention are controlled via the display unit and operating unit of a single one of the power-measuring devices. In this manner, a particularly simple operation is possible.

By preference, the measuring unit here is embodied to measure a current and voltage on the first phase of the multiphase system, especially three-phase system, and to calculate the power of the first phase from the current and the voltage on the first phase. In this manner, a particularly simple and accurate power measurement can be made.

By preference, the communications unit is embodied to be connected to a serial or parallel or annular communications bus and, by means of the communications bus, to communicate with the at least one further power-measuring device. Accordingly, a very simple communication between the power-measuring devices is possible.

The communications unit preferably comprises a bidirectional digital coaxial connector. In this case, it is embodied to be connected by means of this connector to the at least one further power-measuring device. Alternatively, the communications unit comprises a unidirectional digital coaxial-input connector and a unidirectional digital coaxial-output connector. In this case, the communications unit is embodied to be connected by means of the unidirectional digital coaxial-input connector and the unidirectional digital coaxial-output connector to the at least one further power-measuring device. An annular connection of a larger number of power-measuring devices is also possible via these connectors. This allows great flexibility in the construction of the power-measuring devices and of a measuring system made up from them.

By preference, the communications unit comprises a connector interface which is embodied to establish an automatic connection to the at least one further power-measuring device. The automatic connection here can be made either directly through wireless connection of the power-measuring devices by means of the respective connector interface. Alternatively, the automatic connection can be made by means of a connector device onto which the power-measuring device and the at least one further power-measuring device can be plugged. Accordingly, a very simple wireless connection of the power-measuring devices is possible.

Furthermore, a particularly accurate synchronisation is possible, because no inaccuracies can occur as a result of different cable lengths or cabling pathways.

By preference, the communications unit is embodied to implement a synchronisation of the power-measuring device and the at least one further power-measuring device for the phase-coherent measurement. Additionally or alternatively, the communications unit is embodied to transmit measured results and/or to transmit control commands. In this manner, all information and commands to be exchanged between the power-measuring devices can be exchanged via the communications unit. This allows a particularly simple construction of the power-measuring device.

By preference, the communications unit is further embodied to transmit a synchronisation message to the at least one further power-measuring device for the synchronisation of the power-measuring device and the at least one further power-measuring device, to wait for and to determine a time duration until the arrival of a response of the at least one further power-measuring device and to estimate half of the time duration until the arrival of the response of the at least one further power-measuring device as the transmission time of the synchronisation message. In this case, the measuring unit is embodied to take into consideration, in processing the measured results of the at least one further power-measuring device, the estimated transmission time of the synchronisation message as a delay of a transmission of control commands and measured results. In this manner, a particularly accurate synchronisation is possible. Accordingly, particularly accurate measured results can be achieved.

The communications unit is preferably further embodied to communicate with at least two, especially two, or three, or four, or five, or six, or seven, or eight, or nine, or ten further power-measuring devices. The power-measuring device is then embodied, jointly with the further power-measuring devices, to measure a power on further phases of the multiphase system, especially three-phase system. This achieves a particularly good measurement flexibility.

The measuring system according to the invention comprises a first and a second power-measuring device as described previously. The communications unit of the first power-measuring device and the communications unit of the at least one second power-measuring device are connected to one another in this context. The communications units are embodied to communicate with one another. The first power-measuring device and the at least one second power-measuring device are embodied in this context jointly to measure a power on at least two phases of the multiphase system, especially three-phase system. In this manner, an accurate measurement can be achieved with low start-up investment.

By preference, the power-measuring devices can be operated as described previously in a master-mode and in a slave-mode. For example, the first power-measuring device is operated in the master-mode, and the second power-measuring device is operated in the slave-mode. In this manner, the tasks within the measuring system are clearly distributed. This allows a particularly simple operation and a particularly simple read-out of measured results.

By preference, the measuring system comprises at least one, preferably two, further (second) power-measuring device(s). Each of the second power-measuring devices is embodied to measure a power on a different phase of the three-phase system. The first power-measuring device and the second power-measuring devices are embodied jointly to measure the power on a plurality of phases, preferably on all phases of the multiphase system, preferably three-phase system. In this manner, a very accurate measurement of the entire line can be implemented. The inclusion of further second power-measuring devices in the measuring system allows a plurality of further measurements, for example, in coupled primary and secondary power circuits.

By preference, the power-measuring devices of the measuring system are embodied to implement the previously described synchronisation method. In this context, the first power-measuring device is embodied to transmit the synchronisation message to the at least one second power-measuring device. The at least one second power-measuring device is then embodied to transmit a response to the synchronisation message to the first power-measuring device as soon it has received the synchronisation message. In this manner, a particularly accurate synchronisation can be made.

By preference, the measuring system comprises measurement lines of identical length for the connection of the first power-measuring device and the at least one second power-measuring device to the phases of the multiphase system. As a result of the identical line lengths, identical signal delays are achieved. A synchronisation can therefore be simplified. Accordingly, a more accurate synchronisation can also be achieved.

By preference, the power-measuring devices of the measuring system comprise the previously described connector interface. The measuring system then comprises a connector device for the automatic connection of the power-measuring devices in the case of a plugging together of the respective power-measuring device and the connector device. This achieves a particularly simple connection of the power-measuring devices.

In the following, the invention is described on the basis of the drawings which illustrate one advantageous exemplary embodiment of the invention by way of example. The drawings show:

FIG. 1 a block-circuit diagram of an exemplary embodiment of the power-measuring device according to the invention in a block-circuit diagram;

FIG. 2 a block-circuit diagram of a first exemplary embodiment of the measuring system according to the invention;

FIG. 3 a block-circuit diagram of a second exemplary embodiment of the measuring system according to the invention, and FIG. 4 a block-circuit diagram of a third exemplary embodiment of the measuring system according to the invention.

Initially, the construction and general functioning of an exemplary embodiment of the power-measuring device according to the invention is explained on the basis of FIG. 1. with the example of a three-phase current measurement. With reference to FIG. 2-FIG. 4, different connection options of the power-measuring devices of the measuring system according to the invention will then be described. In some cases, the presentation and description of identical elements in similar drawings have not been repeated.

FIG. 1 shows an exemplary embodiment of the power-measuring device 1 according to the invention. The power-measuring device 1 is connected to a mains connection 5 and to a device under test 4. The device under test 4 is also connected to the mains connection 5. For the sake of visual clarity, only the connections of the phase L1 and of the neutral conductor N relevant for the measurement with the power-measuring device 1 are illustrated here. In fact, the phases L2 and L3 of the mains connection 5 and of the device under test 4 are also connected to one another in each case.

The power-measuring device 1 contains a measuring unit 10, a display unit 11, an operating unit 12, a communications unit 13 and a control unit 14. In this context, the control unit 14 is connected to all further units 10-13 and controls the latter. The measuring unit 10 contains a voltage measuring unit 10a and a current measuring unit 10b. Each of these units 10a, 10b is connected individually to the control unit 14.

The measuring unit 10 is further connected to one phase of the three-phase system. Accordingly, the voltage measuring unit 10a is connected to the device under test before and after the passage of a measurement current. That is, the voltage measuring unit 10a is connected to the connectors L1 and N of the device under test 4. By contrast, the current measuring unit 10b is connected in series to the device under test. That is, it is connected to the connectors L1 of the mains connection 5 and L1 of the device under test 4.

If a measurement is to be implemented only on one phase, the measuring device 1, especially the measuring unit 10, is connected to the three-phase system as described previously. A user can start the measurement by means of the operating unit 12. The measuring unit 10 performs the measurement under the control of the control unit 14. A plurality of measuring points are recorded separately according to current and voltage and transmitted to the control unit 14. From these, the control unit 14 can determine the power by multiplication. Alternatively, the power determination can also already be implemented within the measuring unit 10. Measured results are accordingly displayed on a display unit 11. An operating guide can also be provided by means of the display unit 11.

However, if measurements are now to be implemented simultaneously on several phases of the three-phase system, two or more measuring devices according to the invention can be connected to one another by means of the communications unit 13. Each of the measuring devices is then connected by means of its respective measuring unit 10 to one phase of the three-phase system corresponding to the first measuring device 1. Each of the measuring devices implements its measurement on the respective phase independently of one another. The measured results of the individual measuring devices can then be transmitted to a central control computer.

Alternatively, one of the measuring devices can take over the role of the control computer. In this case, this measuring device operates in a master-mode and controls the other measuring devices. Furthermore, it receives measured results from the other measuring devices. A further processing and display of the measured results of all measuring devices then takes place in the master power-measuring device. The operation of all measuring devices can also be implemented via the master power-measuring device. In this case, all further power-measuring devices operate in a slave-mode and transmit all measured results to the master power-measuring device. When a measuring device is operating in the slave-mode, its operating unit and display unit are switched off. The operation and also the display of measured results takes place only via the operating unit and the display unit of the master power-measuring device.

The details of connection options for the measuring devices will be described in greater detail with reference to FIGS. 2 to 4.

FIG. 2 shows a first exemplary embodiment of the measuring system 29 according to the invention. The measuring system contains a first power-measuring device 1, a second power-measuring device 2 and a third power-measuring device 3. The first power-measuring device 1 comprises a first bidirectional coaxial connector 20 and a second bidirectional coaxial connector 21. In this example, the first measuring device 1 is connected to a first phase of a three-phase system, that is, a current I1 and a voltage U1 are measured by the first power-measuring device 1 and converted into a power.

The second power-measuring device 2 comprises a first bidirectional coaxial connector 22 and a second bidirectional coaxial connector 23. In this example, it is connected to a second phase of the three-phase system, that is, a current I2 and a voltage U2 are measured by the second power-measuring device 2 and converted into a corresponding power.

The third power-measuring device 3 comprises a first bidirectional coaxial connector 24 and a second bidirectional coaxial connector 25. In this example, it is connected to a third phase of the three-phase system, that is, a current I3 and a voltage U3 are measured by the third power-measuring device 3 and converted into a corresponding power.

The second bidirectional coaxial connector 21 of the first measuring device 1 is connected by means of a coaxial line 26 to the first bidirectional coaxial connector 22 of the second measuring device 2. The second bidirectional coaxial connector 23 of the second measuring device 2 is connected by means of a coaxial line 27 to the first bidirectional coaxial connector 24 of the third measuring device 3. The three measuring devices 1-3 are connected to one another via the coaxial lines 26 and 27. In this manner, they can communicate with one another. For example, if the second measuring device 2 is configured in a master-mode, and the first measuring device 1 and the third measuring device 3 are each configured in a slave-mode, the second measuring device 2 controls the first measuring device 1 and the third measuring device 3 via the coaxial lines 26 and 27. At the same time, measured results from the measuring devices 1, 3 are transmitted by the slave measuring devices 1, 3 to the master measuring device 2.

The use of bidirectional connections in each case at one individual connector is, however, disadvantageous, because an internal switch-over between a transmission mode and a reception mode is necessary at every individual coaxial connector 20-25. This requires a certain time and therefore limits the rate of communication.

FIG. 3 shows a second exemplary embodiment of the measuring system 39 according to the invention. Here, the measuring devices 1-3 each comprise two unidirectional coaxial connectors 30-35.

The first measuring device 1 comprises a unidirectional coaxial-input connector 30 and a unidirectional coaxial-output connector 31. The second measuring device 2 comprises a unidirectional coaxial-input connector 32 and a unidirectional coaxial-output connector 33. The third measuring device 3 comprises a unidirectional coaxial-input connector 34 and a unidirectional coaxial-output connector 35.

The first measuring device 1 is connected to the second measuring device 2 via the coaxial-output connector 31, a coaxial line 36 and the coaxial-input connector 32. Furthermore, the second measuring device 2 is connected to the third measuring device 3 via the coaxial-output connector 33, a coaxial line 37 and the coaxial-input connector 34. Furthermore, the third measuring device 3 is connected to the first measuring device 1 via the coaxial-output connector 35, a line 38 and the coaxial-input connector 30. This results in an annular topology of the measuring devices 1-3. Here also, a communication of every measuring device 1-3 with every other measuring device 1-3 is possible.

Finally, FIG. 4 shows a third exemplary embodiment of the measuring system 49. Here, the measuring devices 1-3 each comprise two bidirectional connections 40-45. In each case, the first connection 40, 42, 44 of the measuring devices 1-3 is connected to a common line 47. In each case, the second connections 41, 43 and 45 of the measuring devices 1-3 are connected to one another with a further common line 46. Accordingly, two parallel bus lines are set up between the measuring devices 1-3, by means of which an information transfer can take place.

In addition to a connection of the measuring devices 1-3 by means of coaxial lines, a direct connection of the measuring devices 1-3 is also possible. In this case, each individual measuring device 1-3 comprises a connector interface, which is embodied to establish an automatic connection with one or more power-measuring devices. For example, the connector interface can be arranged in a lateral wall of the housing of the respective measuring device. The measuring devices to be connected to one another can then be arranged side-by-side and connected to one another by pushing together. The corresponding interfaces accordingly engage into one another and establish the connection.

Alternatively, the measuring devices can also be connected via a connector device. This could be fitted into a measuring-device cabinet, for example, as a rear wall. A connection of the connector interface of the respective measuring device to the connector device can be implemented by pushing the measuring device against the rear wall. The connector device is thus embodied to connect several measuring devices to one another in this manner.

Now, in order to implement a measurement on a three-phase system with several phases, as illustrated in FIGS. 2 to 4, it is necessary, especially for high-precision measurements of the phase angle, to establish a time synchronicity between the individual measuring devices 1-3. This can be achieved, for example, in that a master measuring device transmits a synchronisation message to all slave measuring devices. The slave measuring devices respond to the synchronisation message. The time duration between the transmission of the synchronisation message and the arrival of the respective response is measured by the master measuring device. One half of this time is estimated as the transmission time for the synchronisation message. A transmission duration from the master measuring device to all the slave measuring devices is accordingly determined. These transmission times can be used for the time synchronisation of the measured results of the individual measuring devices 1-3.

Alternatively, a timestamp can also be integrated in a synchronisation message. In this case, the response to the synchronisation message contains both the timestamp of the synchronisation message and also its own timestamp. This achieves an even more precise synchronisation.

The invention is accordingly not restricted to the illustrated exemplary embodiment. The measuring system can, of course, also contain more than three measuring devices. It is then also suitable for measuring in multiphase systems with more than three phases. A thermal power measurement or another form of power measurement is also covered by the present invention. Beyond a wiring with coaxial lines and a direct plugging together of the measuring devices or respectively the connector device, a connection to other transmission systems, for example, Ethernet, USB, Wi-Fi, Bluetooth, etc. is also conceivable. Advantageously, all the features described above or features shown in the FIGS. can also be combined arbitrarily with one another within the scope of the invention.

The invention claimed is:

1. Power-measuring devices for measuring the power of a multiphase system comprising:
    a first power-measuring device comprising:
        a meter configured to measure a power of a first phase of the multiphase system;
        a display configured to display measured results of the first power-measuring device and of a second power-measuring device;
        a processor configured to receive and process operating inputs for the first power-measuring device and the second power-measuring device; and
        a communicator configured to communicate with the second power-measuring device,
        wherein the first power-measuring device is configured, jointly with the second power-measuring device, to measure a power at least of the first phase and of a second phase of the multiphase system,
    the second power-measuring device comprising:
        a display configured to display measurement results, and
        a processor configured to operate the second power measuring device by a user,
    wherein each power-measuring device is connected to a single phase, and has the ability to measure the single phase,
    wherein a timestamp is integrated into a synchronization message,
    wherein a respective response to the synchronization message contains both the timestamp of the synchronization message and a response timestamp,
    wherein the first power measuring device and the second power measuring device are controlled via an operating unit of either the first power measuring device or the second power measuring device, and
    wherein the first power-measuring device is operable either as a master-mode or a slave-mode and when the first power measuring device is operated in the slave-mode the measured results are displayed on the display of the second power measuring device.

2. The power-measuring devices according to claim 1, wherein the meter is configured to measure a current and a voltage on the first phase and to calculate the power of the first phase from the current and the voltage on the first phase.

3. The power-measuring devices according to claim 1, wherein the communicator is configured to connect to a serial, parallel or annular communications bus and communicate with the second power-measuring device by the communications bus.

4. The power-measuring devices according to claim 1, wherein:
    the communicator comprises a bidirectional digital coaxial connector, and
    the communicator is configured to connect to the second power-measuring device by the bidirectional digital coaxial connector,
    or
    the communicator comprises a unidirectional digital coaxial-input connector and a unidirectional digital coaxial-output connector, and
    the communicator is configured to be connected to the second power-measuring device by the unidirectional digital coaxial-input connector and the unidirectional digital coaxial-output connector.

5. The power-measuring devices according to claim 1, wherein:
the communicator is configured to communicate with at least a third power-measuring device,
the first power-measuring device is configured, jointly with the at least third power-measuring device, to measure a power on further phases of the multiphase system, and
the multiphase system comprises a three-phase system.

6. The power-measuring devices according to claim 1, wherein:
the first power-measuring device is operable in the master-mode in which the first power-measuring device controls the second power-measuring device, and
the first power-measuring device is operable in the slave-mode in which the first power-measuring device is controlled by the second power-measuring device.

7. The power-measuring devices according to claim 6, wherein:
in the master-mode, the first power-measuring device is configured to:
receive measured results from the second power-measuring device by the communicator, or
display measured results of the first power-measuring device and of the second power-measuring device on the display of the first power-measuring device, or
receive and process operating inputs for the first power-measuring device and the second power-measuring device by the processor of the first power-measuring device, and
in the slave-mode, the meter is configured to:
transmit measured results to the second power-measuring device by the communicator, or
not display measured results on the display of the first power-measuring device, or
not receive and process operating inputs by an operator of the first power-measuring device.

8. The power-measuring devices according to claim 1, wherein the communicator comprises a connector interface, by which a direct connection to the second power-measuring device is established either:
by means of a connector interface of the second power-measuring device in the case of a plugging together of the corresponding connector interfaces of the first power-measuring device and the second power-measuring device,
or
by means of a connector device in the case of a plugging together of the connector interface of the first power-measuring device and the connector device.

9. The power-measuring devices according to claim 1, wherein the communicator is configured to:
implement a synchronization of the first power-measuring device and the second power-measuring device for the phase-coherent measurement, and perform one of:
transmit measured results, or
transmit control commands.

10. The power-measuring devices according to claim 9, wherein the synchronization of the first power-measuring device and the second power-measuring device includes the communicator performing:
transmitting the synchronization message to the second power-measuring device,
determining a time duration between the transmission of the synchronization message and the arrival of the respective response of the second power-measuring device, and
estimating one half of the time duration as a transmission time of the synchronization message,
wherein the meter is configured to consider the estimated transmission time of the synchronization message as a transmission delay of control commands and measured results for processing the measured results of the second power-measuring device.

11. A measuring system comprising:
the first power-measuring device and the second power-measuring device according to claim 1, wherein:
the communicator of the first power-measuring device and a communicator of the second power-measuring device are connected to one another,
the communicator of the first power-measuring device and the communicator of the second power-measuring device are configured to communicate with one another,
the first power-measuring device and the second power-measuring device are configured jointly to measure a power on at least two phases of the multiphase system,
each power-measuring device is connected to a single phase, and has the ability to measure the single phase,
a timestamp is integrated into a synchronization message,
a respective response to the synchronization message contains both the timestamp of the synchronization message and a response timestamp,
the first power measuring device and the second power measuring device are controlled via an operating unit of either the first power measuring device or the second power measuring device, and
wherein the first power-measuring device is operable either as a master-mode or a slave-mode and when the first power measuring device is operated in the slave-mode measured results are displayed on a display of the second power measuring device.

12. The measuring system according to claim 11, wherein:
the first power-measuring device is configured to transmit the synchronization message to the second power-measuring device, and
the second power-measuring device is configured to transmit the response to the synchronization message to the first power-measuring device as soon the second power-measuring device has received the synchronization message.

13. The measuring system according to claim 11, wherein the measuring system comprises measurement lines of identical length for connecting the first power-measuring device and the second power-measuring device to the phases of the multiphase system.

14. The measuring system according to claim 11, wherein the measuring system comprises the connector device for the direct connection of each power measuring device in the case of a plugging together of the connector interface of each power-measuring device and the connector device.

15. The measuring system according to claim 11, wherein:
the first power-measuring device is configured to operate in the master-mode, and
the second power-measuring device is configured to operate in the slave-mode.

16. The measuring system according to claim 15, wherein:
the measuring system comprises at least a third power-measuring device,
each power-measuring device is configured to measure a power on a different phase of the multiphase system, each power-measuring device is configured jointly to
measure the power on a plurality of phases of the
multiphase system, and
the multiphase system comprises a three-phase system.

* * * * *